United States Patent
Lee et al.

(10) Patent No.: US 11,203,818 B2
(45) Date of Patent: Dec. 21, 2021

(54) SILICON BASED FUSION COMPOSITION AND MANUFACTURING METHOD OF SILICON CARBIDE SINGLE CRYSTAL USING THE SAME

(71) Applicant: LG Chem, Ltd., Seoul (KR)

(72) Inventors: Ho Rim Lee, Daejeon (KR); Chan Yeup Chung, Daejeon (KR); Manshik Park, Daejeon (KR); Jung Min Ko, Daejeon (KR)

(73) Assignee: LG Chem, Ltd.

( * ) Notice: Subject to any disclaimer, the term of this patent is extended or adjusted under 35 U.S.C. 154(b) by 79 days.

(21) Appl. No.: 16/494,523

(22) PCT Filed: May 30, 2018

(86) PCT No.: PCT/KR2018/006161
§ 371 (c)(1),
(2) Date: Sep. 16, 2019

(87) PCT Pub. No.: WO2019/004611
PCT Pub. Date: Jan. 3, 2019

(65) Prior Publication Data
US 2020/0010973 A1  Jan. 9, 2020

(30) Foreign Application Priority Data
Jun. 29, 2017 (KR) .......................... 10-2017-0082781

(51) Int. Cl.
*C30B 29/36* (2006.01)
*C30B 9/04* (2006.01)

(52) U.S. Cl.
CPC ................ *C30B 9/04* (2013.01); *C30B 29/36* (2013.01)

(58) Field of Classification Search
CPC .. C30B 15/02; C30B 9/04; C30B 9/10; C30B 29/36
See application file for complete search history.

(56) References Cited

U.S. PATENT DOCUMENTS

| 8,118,933 B2 | 2/2012 | Sakamoto et al. |
| 2002/0104478 A1 | 8/2002 | Oguri et al. |

(Continued)

FOREIGN PATENT DOCUMENTS

| CN | 1863945 A | 11/2006 |
| EP | 3406769 A1 | 11/2018 |

(Continued)

OTHER PUBLICATIONS

Search Report from Chinese Office Action for Application No. 2018800129288 dated Oct. 12, 2020; 2 pages.

(Continued)

*Primary Examiner* — Robert M Kunemund
(74) *Attorney, Agent, or Firm* — Lerner, David, Littenberg, Krumholz & Mentlik, LLP

(57) ABSTRACT

The present disclosure relates to a silicon-based fusion composition used for a solution growth method for forming a silicon carbide single crystal, and represented by the following Formula 1, including silicon, a first metal (M1), scandium (Sc) and aluminum (Al):

$$Si_aM1_bSc_cAl_d \qquad \text{(Formula 1)}$$

wherein a is more than 0.4 and less than 0.8, b is more than 0.2 and less than 0.6, c is more than 0.01 and less than 0.1, and d is more than 0.01 and less than 0.1.

10 Claims, 10 Drawing Sheets

(56) References Cited

U.S. PATENT DOCUMENTS

| | | |
|---|---|---|
| 2006/0292057 A1 | 12/2006 | Nakamura |
| 2009/0178610 A1 | 7/2009 | Sakamoto et al. |
| 2009/0194017 A1 | 8/2009 | Terashima et al. |
| 2012/0237428 A1 | 9/2012 | Ryo et al. |
| 2016/0122900 A1* | 5/2016 | Kamei .................... C30B 15/00 117/78 |
| 2016/0273126 A1 | 9/2016 | Kusunoki et al. |
| 2017/0370018 A1* | 12/2017 | Domoto ................ C30B 19/08 |
| 2018/0127891 A1 | 5/2018 | Chung et al. |
| 2019/0106806 A1* | 4/2019 | Chung .................... H01L 21/02 |

FOREIGN PATENT DOCUMENTS

| | | | |
|---|---|---|---|
| JP | 2007076986 A | | 3/2007 |
| JP | 2007277049 A | | 10/2007 |
| JP | 2009184879 A | | 8/2009 |
| JP | 2010228939 A | | 10/2010 |
| JP | 2011051857 A | | 3/2011 |
| JP | 2012111670 A | | 6/2012 |
| JP | 5244007 B2 | | 7/2013 |
| JP | 2014166935 A | | 9/2014 |
| JP | 2016169126 A | | 9/2016 |
| JP | 2016185884 A | | 10/2016 |
| KR | 101070412 B1 | | 10/2011 |
| KR | 20120057536 A | | 6/2012 |
| KR | 20120091054 A | | 8/2012 |
| KR | 20160078343 A | | 7/2016 |
| KR | 20170048216 A | | 5/2017 |
| KR | 20180035659 A | | 4/2018 |
| WO | 2014189008 A1 | | 11/2014 |
| WO | PCT/JP2016/051449 | * | 1/2016 |
| WO | 2017073984 A1 | | 5/2017 |

OTHER PUBLICATIONS

International Search Report for Application No. PCT/KR2018/006161, dated Sep. 6, 2018, pp. 1-2.

* cited by examiner

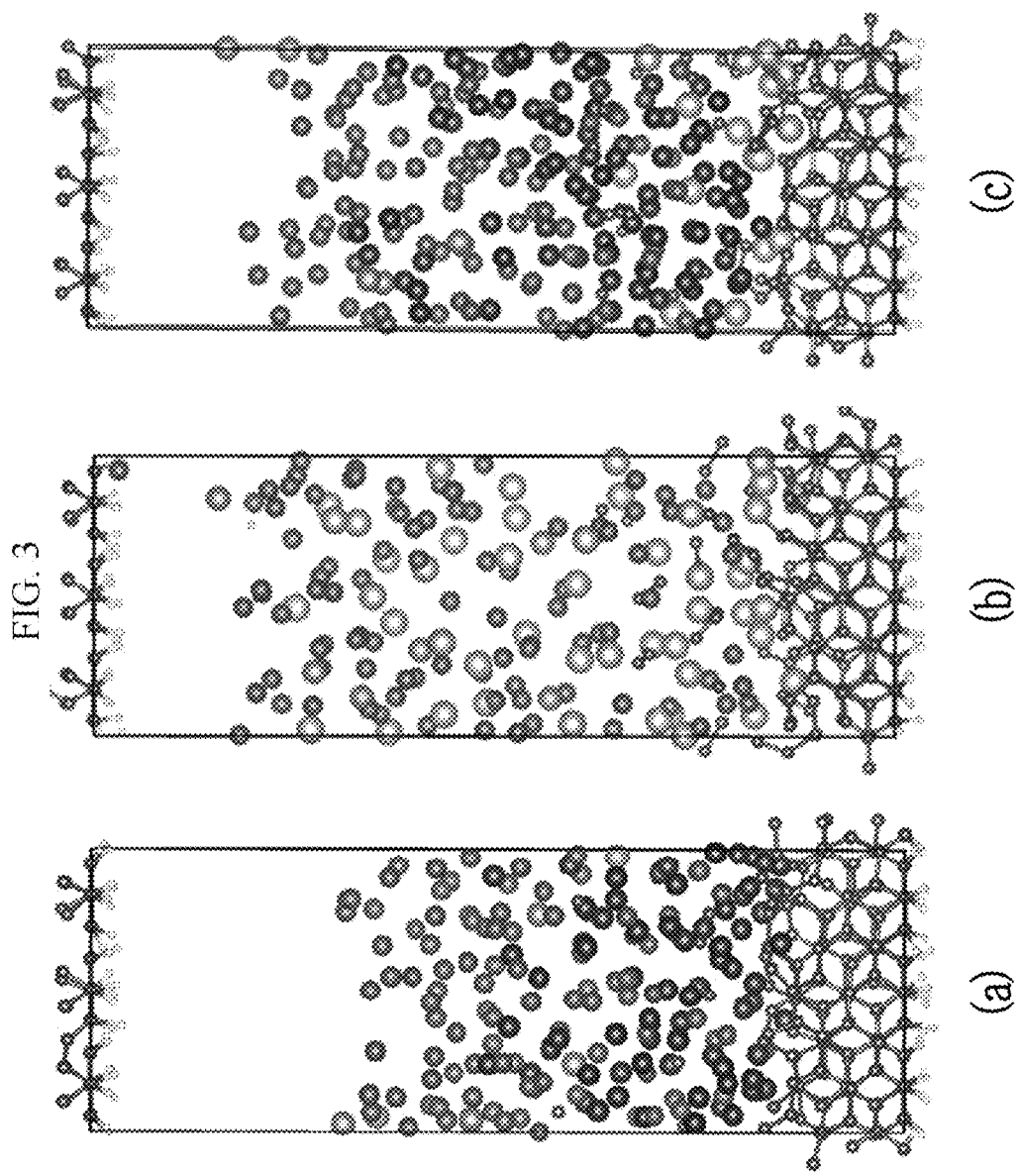

SILICON BASED FUSION COMPOSITION AND MANUFACTURING METHOD OF SILICON CARBIDE SINGLE CRYSTAL USING THE SAME

CROSS-REFERENCE TO RELATED APPLICATIONS

This application is a national phase entry under 35 U.S.C. § 371 of International Application No. PCT/KR2018/006161, filed May 30, 2018, which claims priority to Korean Patent Application No. 10-2017-0082781, filed Jun. 29, 2017, the disclosures of which are incorporated herein by reference.

TECHNICAL FIELD

The present invention relates to a silicon-based fusion composition, and a manufacturing method of a silicon carbide single crystal using the same.

BACKGROUND ART

An electric power semiconductor device is a core device in a next generation system using electrical energy such as electric vehicles, electric power systems and high frequency mobile communications. For the device, selection of a suitable material for high voltage, high current, high frequency, and the like, is needed. A silicon single crystal has been used as an electric power semiconductor material, however, due to the limitation of the physical properties thereof, a silicon carbide single crystal having a less energy loss and capable of being driven in a more extreme environment is drawing attention.

For growth of the silicon carbide single crystal, by way of example, a sublimation method in which silicon carbide as a raw material is sublimated at a high temperature of 2000 degrees (° C.) or more to grow a single crystal, a solution growth method of applying a crystal pulling method, a chemical vapor deposition method using a gaseous source, or the like are being used.

In the case of using the chemical vapor deposition method, the crystal may be grown to a level of a thin film having a limited thickness, and in the case of using the sublimation method, defects such as micropipes and lamination defects are likely to occur, and thus, there is a limitation in terms of production cost. Studies on a solution growth method which has a lower crystal growth temperature than the sublimation method, and is known to be advantageous for having a larger diameter and higher quality are being conducted.

DISCLOSURE

Technical Problem

The present invention has been made in an effort to provide a silicon-based fusion composition having advantages of reducing process time and cost by providing a rapid crystal growth speed. In addition, the present invention has been made in an effort to provide a silicon-based fusion composition having advantages of providing a silicon carbide single crystal having excellent quality. In addition, the present invention has been made in an effort to provide a manufacturing method of a silicon carbide single crystal, using the above-described silicon-based fusion composition.

In addition, the technical problem to be solved in the present invention is not limited to the above-described technical problems, and other technical problems which are not mentioned herein may be clearly understood by a person having ordinary skill in the art to which the present invention pertains, from the following description.

Technical Solution

An exemplary embodiment of the present invention provides a silicon-based fusion composition which is used for a solution growth method for forming a silicon carbide single crystal, and represented by the following Formula 1, including silicon, a first metal (M1), scandium (Sc) and aluminum (Al):

$$Si_aM1_bSc_cAl_d \qquad \text{(Formula 1)}$$

wherein a is more than 0.4 and less than 0.8, b is more than 0.2 and less than 0.6, c is more than 0.01 and less than 0.1, and d is more than 0.01 and less than 0.1.

The first metal (M1) may include at least one selected from the group consisting of titanium (Ti), chromium (Cr), vanadium (V), yttrium (Y), manganese (Mn), iron (Fe), cobalt (Co), boron (B), cerium (Ce), lanthanum (La) and praseodymium (Pr).

In Formula 1, a may be more than 0.5 and less than 0.7, b may be more than 0.2 and less than 0.4, and d may be more than 0.01 and less than 0.05.

The silicon-based fusion composition may have a carbon solubility of 5% or more.

The scandium may increase the carbon solubility in the silicon-based fusion.

Another embodiment of the present invention provides a manufacturing method of a silicon carbide single crystal including: preparing a silicon carbide seed crystal; preparing a silicon-based fusion composition including silicon, a first metal (M1), scandium and aluminum (Al), and represented by the following Formula 1; adding carbon (C) to the silicon-based fusion composition to form a fused solution; and supercooling the fused solution to grow the silicon carbide single crystal on the seed crystal:

$$Si_aM1_bSc_cAl_d \qquad \text{(Formula 1)}$$

wherein a is more than 0.4 and less than 0.8, b is more than 0.2 and less than 0.6, c is more than 0.01 and less than 0.1, and d is more than 0.01 and less than 0.1.

The silicon carbide may have a growth speed of 80 μm/h or more.

Advantageous Effects

The silicon-based fusion composition according to an exemplary embodiment may reduce process time and cost by providing a rapid crystal growth speed. In addition, a silicon carbide single crystal having excellent quality may be provided.

DESCRIPTION OF THE DRAWINGS

FIG. 3 ((a), (b) and (c)) is AIMD simulation images for reviewing carbon solubilities of Comparative Examples 1 and 2, and Example 1, respectively.

MODE FOR INVENTION

Figure 1:
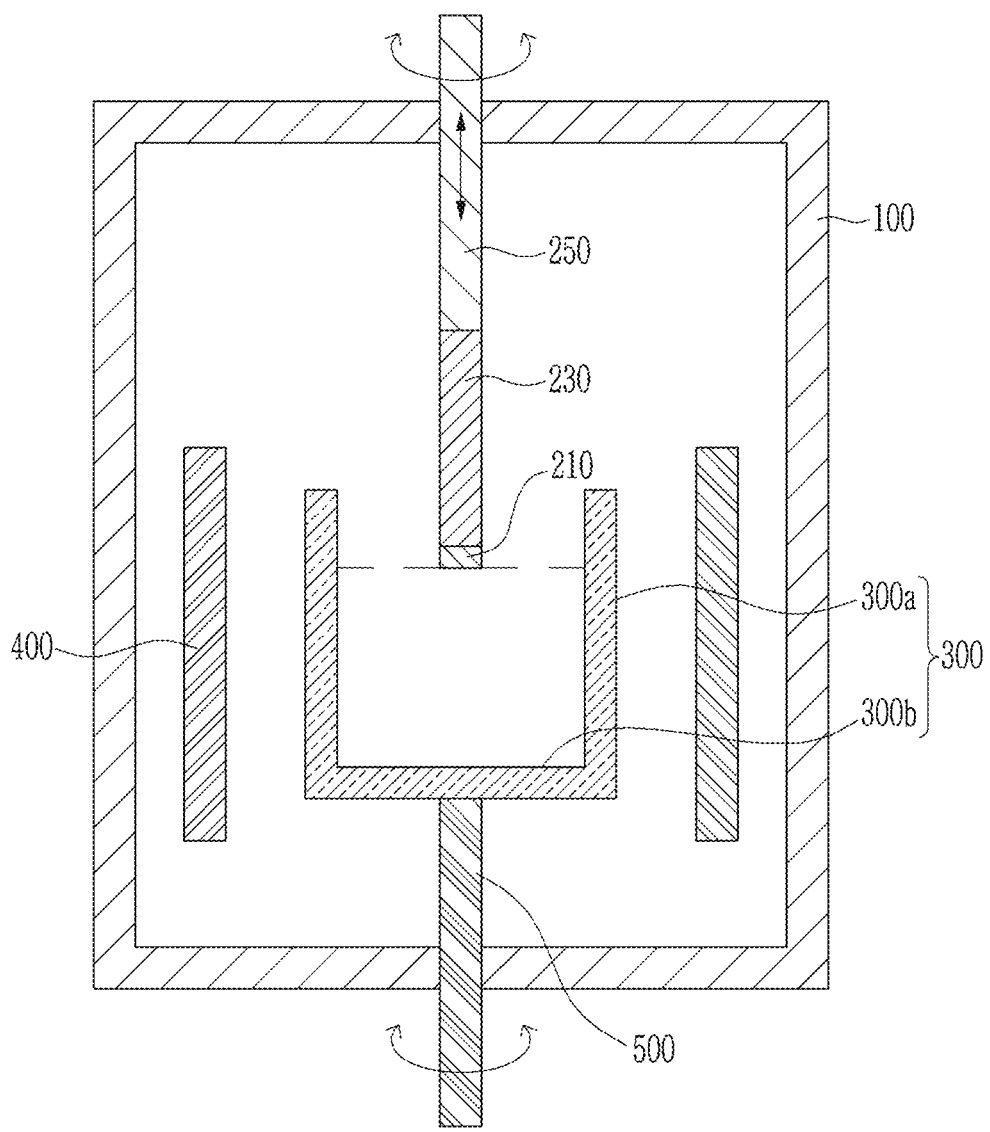
FIG. 1 is a schematic cross-sectional view of a manufacturing apparatus of the silicon carbide single crystal according to an exemplary embodiment.

Hereinafter, the exemplary embodiments of the present invention will be described in detail, referring to the accompanying drawings. However, in the description of the present disclosure, descriptions for already known functions or components will be omitted for clarifying the gist of the present disclosure.

In order to clearly describe the present disclosure, parts which are not related to the description are omitted, and the same reference numeral refers to the same or like components, throughout the specification. In addition, since the size and the thickness of each component shown in the drawing are optionally represented for convenience of the description, the present disclosure is not limited to the illustration.

Hereinafter, the silicon-based fusion composition according to an exemplary embodiment will be described.

The silicon-based fusion composition according to an exemplary embodiment may include silicon (Si), a first metal (M1), scandium (Sc) and aluminum (Al). The silicon-based fusion composition may be represented by the following Formula 1. The first metal (M1) may be include at least one selected from the group consisting of titanium (Ti), chromium (Cr), vanadium (V), yttrium (Y), manganese (Mn), iron (Fe), cobalt (Co), boron (B), cerium (Ce), lanthanum (La) and praseodymium (Pr).

$$Si_aM1_bSc_cAl_d$$  (Formula 1)

In Formula 1, a may be more than 0.4 and less than 0.8, b may be more than 0.2 and less than 0.6, c may be more than 0.01 and less than 0.1, and d may be more than 0.01 and less than 0.1.

That is to say, a content of silicon in the silicon-based fusion composition may be more than 40 at % and less than 80 at %, and the sum of a content of the first metal (M1) may be more than 20 at % and less than 60 at %. When the content of the first metal (M1) is 20 at % or less, the solubility of carbon in the silicon-based fusion composition is lowered, thereby significantly decreasing the growth speed of the silicon carbide single crystal. When the content of the first metal (M1) is 80 at % or more, a compound of the metal and silicon is produced, or carbon in the silicon-based fused solution may be precipitated in the form of graphite, not in the form of silicon carbide, and polycrystallization of silicon carbide may occur due to an excessively high carbon solubility, thereby deteriorating the quality of the silicon carbide crystal.

Scandium (Sc) may be included at more than 1 at % and less than 10 at % in the silicon-based fusion composition represented by Formula 1. Scandium (Sc) may improve the carbon solubility in the silicon-based fused solution to improve the growth speed of the silicon carbide single crystal. When scandium (Sc) is included at 1 at % or less, the effect of improving the carbon solubility in the silicon-based fused solution may be insignificant, and when Sc is included at 10 at % or more, reliability of the process may be lowered, for example, instability of the silicon-based fused solution may be caused to elute the fused solution to the outside of a crucible.

Aluminum (Al) may be included in a content more than 1 at % and less than 10 at % in the silicon-based fusion composition represented by Formula 1. Aluminum (Al) may suppress production of a polycrystal in the growth process of the silicon carbide single crystal, and improve crystallinity of the silicon carbide single crystal to be obtained. Aluminum (Al) provides a uniform crystal nucleus over an entire growth surface of the silicon carbide single crystal. Accordingly, the silicon carbide single crystal having a flat shape may be obtained. When a crystal nucleus having an uneven growth surface is included, a silicon carbide polycrystal grows.

The silicon-based fusion composition according to an exemplary embodiment may include silicon, the first metal (M1) for increasing the carbon solubility in the fused solution, scandium (Sc) for increasing the carbon solubility in the fused solution, and aluminum (Al) for increasing the crystallinity of the silicon carbide single crystal, at predetermined contents, thereby obtaining the silicon carbide single crystal having better quality. In addition, the silicon-based fusion composition according to an exemplary embodiment may provide a rapid single crystal growth speed, and thus, may reduce time and cost required for obtainment.

Hereinafter, a method for obtaining the silicon carbide single crystal using the above-described silicon-based fusion composition will be described, referring to the manufacturing apparatus of FIG. 1. FIG. 1 is a schematic cross-sectional view of the manufacturing apparatus used when growing the silicon carbide single crystal.

Referring to FIG. 1, the manufacturing apparatus of the silicon carbide single crystal according to an exemplary embodiment may include a reaction chamber 100, a crucible 300 disposed inside of the reaction chamber 100, a seed crystal 210 extended to the inside of the crucible 300, a seed crystal support portion 230 connected to the seed crystal 210, a moving member 250, and a heating member 400 for heating the crucible 300.

The reaction chamber 100 has a closed and sealed form to include an empty interior space, and the inside may be maintained by an atmosphere such as constant pressure. Though not shown, a vacuum pump and a gas tank for controlling atmosphere may be connected to the reaction chamber 100. The vacuum pump and the gas tank for controlling atmosphere are used to vacuum the inside of the reaction chamber 100, and then inert gas such as argon gas may be filled therein.

The silicon carbide seed crystal 210 may be connected to the seed crystal support portion 230 and the moving member 250 to be disposed inside of the crucible 300, and in particular, to be disposed so that the seed crystal may be in contact with the fused solution provided inside of the crucible 300. This fused solution may include the above-described silicon-based fusion composition.

According to an exemplary embodiment, a meniscus may be formed between the surface of the silicon carbide seed crystal 210 and the fused solution. The meniscus refers to a curved surface formed on the fused solution by surface tension occurring when the lower surface of the silicon carbide seed crystal 210 is brought into contact with the fused solution and then slightly lifted. When the silicon carbide single crystal is grown by forming the meniscus, occurrence of the polycrystal is suppressed, thereby obtaining a higher quality single crystal.

The silicon carbide seed crystal 210 is formed of a silicon carbide single crystal. The crystal structure of the silicon carbide seed crystal 210 is the same as the silicon carbide single crystal to be manufactured. For example, when a 4H polytype silicon carbide single crystal is manufactured, a 4H polytype silicon carbide seed crystal 210 may be used. When 4H polytype silicon carbide seed crystal 210 is used, a crystal growth surface may be the (0001) plane or (000-1) plane, or an inclined surface at an angle of 8° or less from the (0001) plane or (000-1) plane.

The seed crystal support portion 230 connects the seed crystal 210 and the moving member 250. One end of the seed crystal support portion 230 may be connected to the moving member 250, and the other end may be connected to the seed crystal 210.

The seed crystal support portion 230 is connected to the moving member 250 and may be moved in a vertical direction along the height direction of the crucible 300. Specifically, the seed crystal support portion 230 may be moved to the inside of the crucible 300 for the growth process of the silicon carbide single crystal, or moved to the outside of the crucible 300 after finishing the growth process of the silicon carbide single crystal. In addition, in the present specification, the exemplary embodiment in which the seed crystal support portion 230 is moved in a vertical direction is described, but not limited thereto, and the seed crystal support portion 230 may be moved or rotated in any direction, and a known means for this may be included.

The seed crystal support portion 230 may be attached to and detached from the moving member 250. The seed crystal support portion 230 may be coupled to the moving member 250 so that the seed crystal is provided inside of the crucible 300 for obtaining the silicon carbide single crystal, and separated from the moving member 250 after the growth process of the single crystal is finished.

The moving member 250 may be connected to a driving portion (not shown) to move or rotate the inside of the chamber 100. The moving member 250 may include a known means for vertical moving or rotating.

The crucible 300 may be provided inside of the reaction chamber 100, in the form of a container having an opened upper side, and include an external circumferential surface 300a and a lower surface 300b, except an upper surface. The crucible 300 may be in any form for forming the silicon carbide single crystal without limitation on the above-described forms. The crucible 300 may be charged with and contain fusion raw materials such as silicon or silicon carbide powder.

The crucible 300 may be made of a carbon-containing material such as graphite and silicon carbide, and the crucible 300 made of the material itself may be utilized as a source of a carbon raw material. Otherwise, without limitation thereto, a crucible made of ceramic may be used, and in this case, a material or source for providing carbon may be provided separately.

The heating member 400 may heat the crucible 300 to fuse or heat the material contained in the crucible 300. The heating member 400 may use a resistance type heating means or induction heating type heating means. Specifically, heats may be formed in a resistive manner in which the heating member 400 itself generates heats, or in an induction heating manner in which the heating member 400 is formed by an induction coil and high-frequency current is allowed to flow in the induction coil, thereby heating the crucible 300. However, the method is not limited thereto, and any heating member may be used, of course.

The manufacturing apparatus of silicon carbide according to an exemplary embodiment may further include the rotating member 500. The rotating member 500 may be coupled to a lower side of the crucible 300 to rotate the crucible 300. Since a fused solution having a uniform composition may be provided by rotating the crucible 300, the silicon carbide single crystal having high quality may grow in the silicon carbide seed crystal 210.

Hereinafter, a manufacturing method of a silicon carbide single crystal using the above-described silicon-based fusion composition and silicon carbide single crystal will be described.

First, initial fusion raw materials including the above-described silicon-based fusion composition are added to the crucible 300. The initial fusion raw material may be in a powder form, but not limited thereto. When the crucible 300 is made of a material containing carbon, the initial fusion raw material may not include carbon separately, but not limited thereto, and the initial fusion raw material may include carbon.

The crucible 300 containing the initial raw material is heated using the heating member 400 under an inert atmosphere such as argon gas. By heating, the initial fusion raw material in the crucible 300 is changed to the fused solution including carbon (C), silicon (Si) and metals (first metal, scandium, aluminum).

After the crucible 300 reaches a predetermined temperature, the temperature of the fused solution in the crucible 300 is slowly lowered, and the carbon solubility in the fused solution is decreased. For this reason, when a silicon carbide supersaturation state is reached in the vicinity of the seed crystal 210, the silicon carbide single crystal grows on the seed crystal 210 using the supersaturation as driving force.

As the silicon carbide single crystal grows, a condition to precipitate silicon carbide from the fused solution may be changed. Here, silicon and carbon are added to adapt the composition of the fused solution over time, thereby maintaining the fused solution to have a composition within a certain range. Silicon and carbon to be added may be added continuously or discontinuously.

When the silicon-based fusion composition according to an exemplary embodiment of the present invention is used, the growth speed of the single crystal to be obtained may be high, thereby reducing time and cost required for the process.

Hereinafter, the Examples, and the Comparative Examples will be described, referring to FIGS. 2 to 5.

Figure 2A:
FIGS. 2A, 2B, 2C, 2D and 2E are cross sectional images of precipitated solidified products according to Comparative Examples 1 and 2, and Examples 1 to 3, respectively.
Figure 2B:
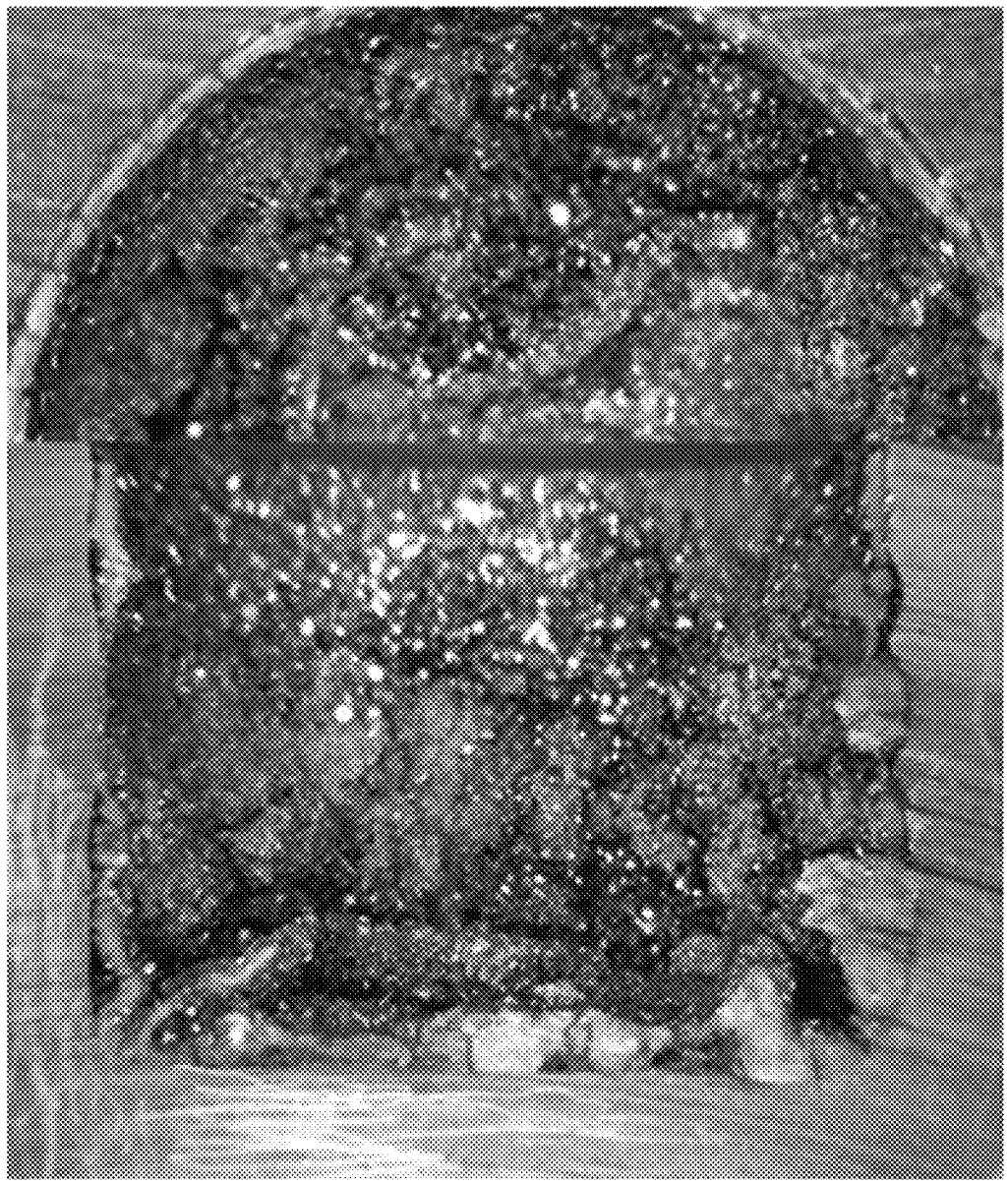
Figure 2C:
Figure 2D:
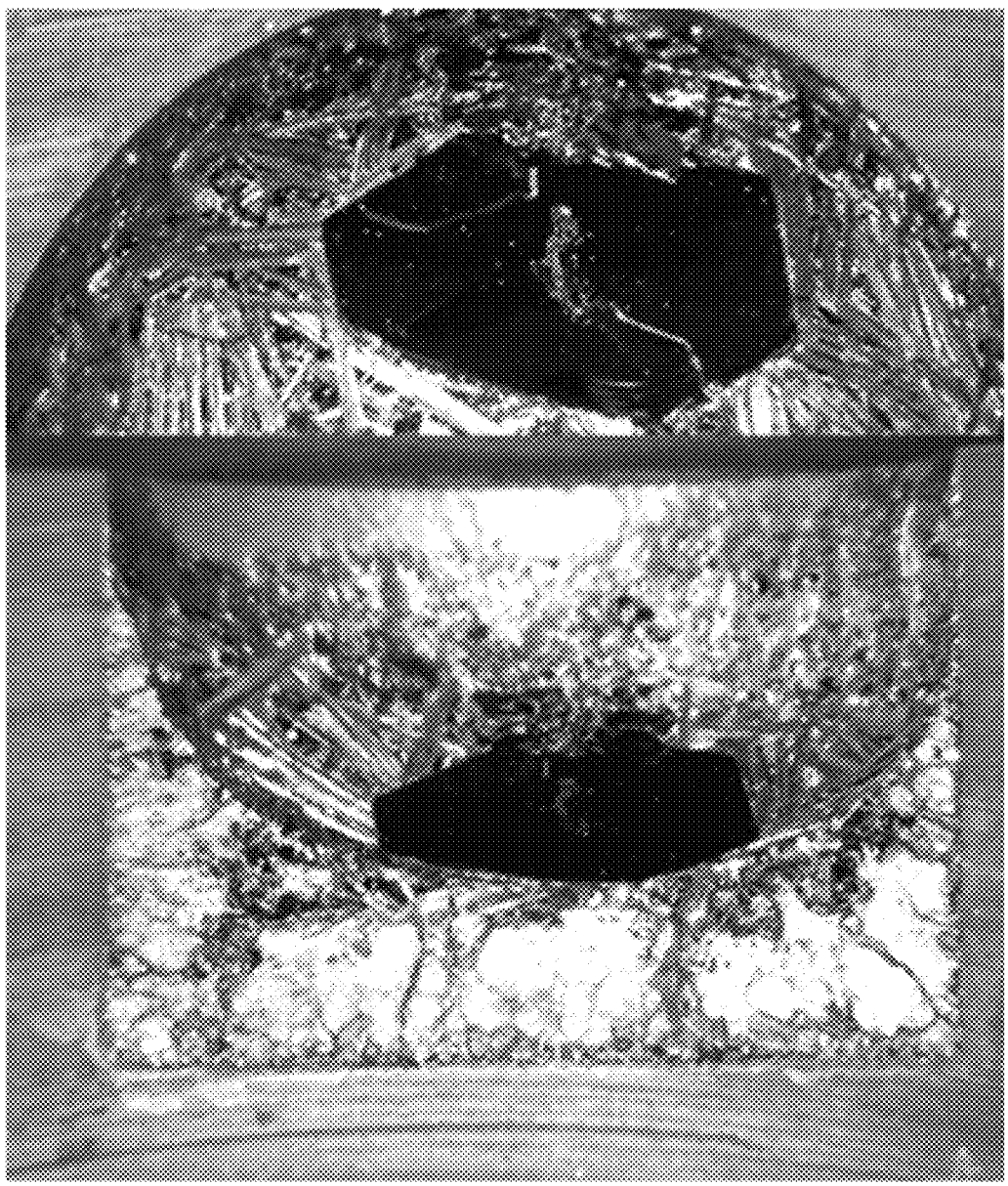
Figure 2E:
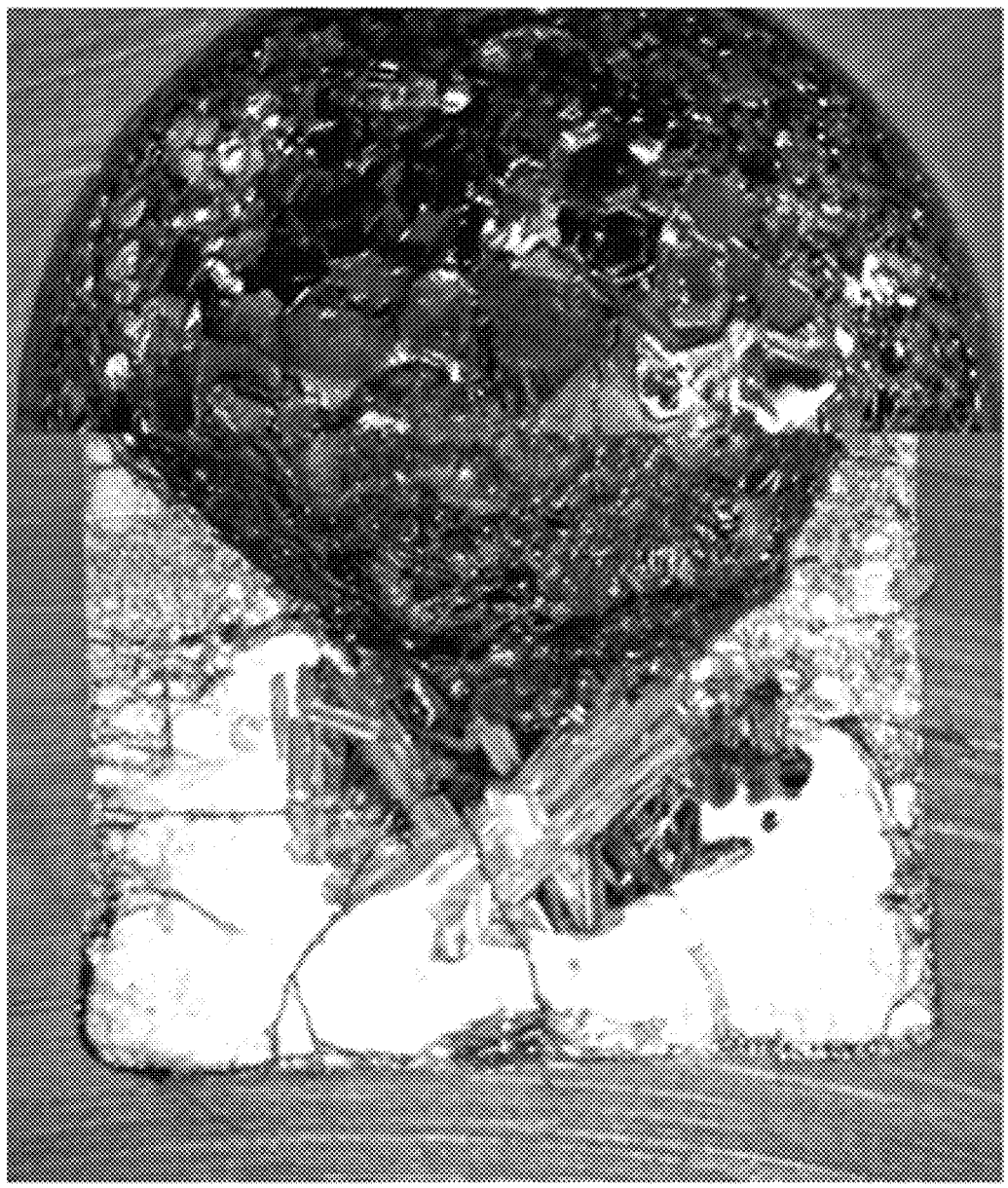

Each of FIG. 2A, FIG. 2B, FIG. 2C, FIG. 2D and FIG. 2E is an image of the surface and the cross section of a solidified product precipitated by a slow cooling method, according to Comparative Example 1, Comparative Example 2, Example 1, Example 2 and Example 3. Specifically, FIG. 2A is an image for Comparative Example 1 including $Si_{0.56}Cr_{0.4}Al_{0.04}$, and FIG. 2B is an image for Comparative Example 2 including $Si_{0.56}Cr_{0.2}Sc_{0.2}Al_{0.04}$. FIG. 2C is an image for Example 1 including $Si_{0.56}Cr_{0.38}Sc_{0.02}Al_{0.04}$, FIG. 2D is an image for Example 2 including $Si_{0.56}Cr_{0.36}Sc_{0.04}Al_{0.04}$, and FIG. 2E is an image for Example 3 including $Si_{0.56}Cr_{0.32}Sc_{0.08}Al_{0.04}$.

The inside of the crucible made of graphite is charged with the initial raw materials according to the chemical composition of Comparative Examples 1 and 2, and Examples 1 to 3, at about 30% by volume. Thereafter, the crucible is fused at 1900 degrees (° C.) for 2 hours, cooled to 1600 degrees (° C.) at a rate of 1 degree (° C.) per minute, and then rapidly cooled, thereby obtaining a crucible having a solidified product formed therein. Thereafter, the crucible was cut, and carbon solubility characteristics and silicon carbide crystallization characteristics depending on each Example and Comparative Example were observed. The carbon solubility of the solidified product was observed using a C—S analyzer.

First, upon review of Comparative Example 1 ($Si_{0.56}Cr_{0.4}Al_{0.04}$) with reference to FIG. 2A, a solidified product in a stable form may be obtained, but a silicon carbide precipitate having a hexagon shape was not found on the surface of the solidified product, and the erosion degree of the crucible was confirmed to be low. The erosion degree of the crucible represents that the carbon solubility in the fused solution is low, and specifically, the carbon solubility of Comparative Example 1 was measured as 4.3%.

Next, it was confirmed in Comparative Example 2 ($Si_{0.56}Cr_{0.2}Sc_{0.2}Al_{0.04}$) shown in FIG. 2B that the graphite crucible was significantly eroded, but the fused solution was overflowed on the wall of the crucible, so that a solidified product hardly remained. That is, it was confirmed that it is difficult to stably proceed with a process with the process of the composition.

Example 1 ($Si_{0.56}Cr_{0.38}Sc_{0.02}Al_{0.04}$) shown in FIG. 2C had a not-high erosion degree of the crucible, as compared with Comparative Example 1, however, it was visually observed that the silicon carbide crystal was precipitated on the surface of the solidified product. In addition, as a result of analyzing the carbon solubility of the solidified product, the carbon solubility of about 5.7% was shown, and thus, high carbon solubility as compared with Comparative Example 1 was confirmed.

It was confirmed in Example 2 ($Si_{0.56}Cr_{0.36}Sc_{0.04}Al_{0.04}$) shown in FIG. 2D that a corner portion of the crucible was eroded, and a very big sized silicon carbide single crystal of about 8 mm was precipitated on the surface of the solidified product. The carbon solubility of the solidified product for Example 2 was measured as about 7.9%.

It was confirmed in Example 3 ($Si_{0.56}Cr_{0.32}Sc_{0.08}Al_{0.04}$) shown in FIG. 2E that the erosion degree of the crucible inner wall was significant, as compared with Examples 1 and 2, thereby having excellent carbon solubility. The carbon solubility of the solidified product for Example 3 was measured as about 10.6%, and it was confirmed that a large amount of hexagonal silicon carbide single crystals was precipitated on the surface of the solidified product.

Hereinafter, FIGS. 3 and 4 will be described. Each of (a), (b) and (c) of FIG. 3 is an AIMD simulation image for reviewing the carbon solubility of Comparative Example 1 ($Si_{0.56}Cr_{0.42}Al_{0.04}$), Comparative Example 2 ($Si_{0.56}Sc_{0.32}Al_{0.04}$) and Example 1 ($Si_{0.46}Cr_{0.43}Sc_{0.08}Al_{0.04}$), and FIG. 4 is a graph which analyzes the mean squared displacement (MSD) of the carbon atom for Comparative Example 1, Comparative Example 2 and Example 1 of (a), (b) and (c) of FIG. 3.

For the carbon solubility properties of Comparative Example 1, Comparative Example 2 and Example 1, $Si_{96}Cr_{72}Al_6C_{144}$, $Si_{96}Sc_{48}Al_6C_{144}$ and $Si_{96}Cr_{90}Sc_{16}Al_6C_{144}$ interface models were optimized with a density functional theory (DFT), and then a mean squared displacement (MSD) simulation of carbon was carried out using Ab initio molecular dynamics (AIMD). In order to observe carbon atom movement and change in short time, AIMD calculation was performed at 4000 K for 5 ps.

As a result of simulating the compositions of Comparative Example 1, Comparative Example 2 and Example 1, it was confirmed that in all compositions, the carbon atom of graphite in the lower portion was diffused to the inside of the silicon-based fused solution after 5 ps. It was confirmed that the degree of carbon atom diffusion was most significant in Example 1, and descended in the order of Comparative Example 2 and Comparative Example 1.

Figure 4:
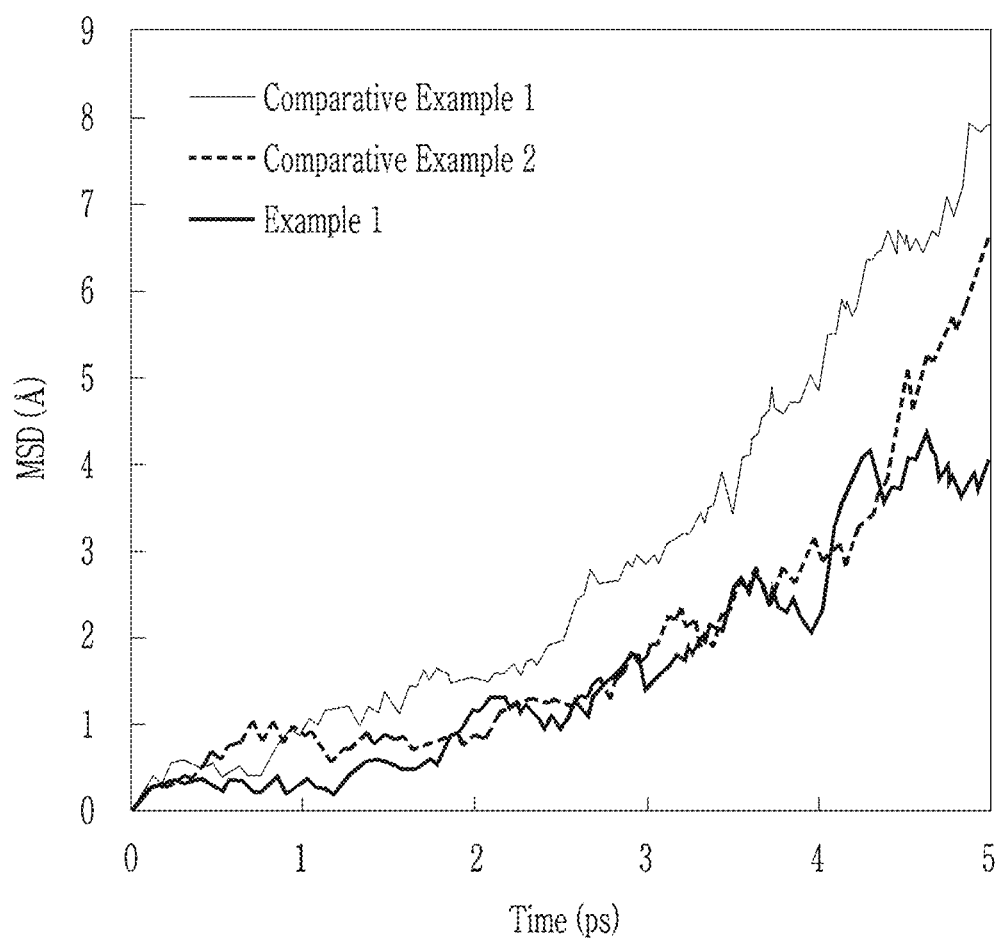
FIG. 4 is a graph which analyzes the mean squared displacement (MSD) of a carbon atom for Comparative Examples 1 and 2, and Example 1 of (a), (b) and (c) of FIG. 3.

In addition, as shown in FIG. 4, Example 1 was confirmed to have a high mean squared displacement value of the carbon atom, as compared with Comparative Examples 1 and 2. This means that the fused composition using chromium-scandium (Cr 43 at %-Sc 8 at %) has a higher carbon solubility than the chemical composition using chromium (Cr 42 at %) or scandium (32 at %) alone, thereby capable of improving a crystal growth speed.

Figure 5A:
FIG. 5A is a growth image of a silicon carbide single crystal according to the Comparative Example.
Figure 5B:
FIG. 5B is a growth image of a silicon carbide single crystal according to the Example.

Hereinafter, the Comparative Example and the Example will be described, referring to FIG. 5. FIG. 5A is an image of growth of the silicon carbide single crystal according to the Comparative Example ($Si_{0.56}Cr_{0.4}Al_{0.04}$), and FIG. 5B is an image of growth of the silicon carbide single crystal according to the Example ($Si_{0.56}Cr_{0.36}Sc_{0.04}Al_{0.04}$).

They are the results of growing the silicon carbide single crystal at 1900° C. for 6 hours by a TSSG method using a 2 inch SiC seed crystal. Specifically, the high-purity graphite crucible is charged with the initial raw materials according to the Comparative Example and the Example, and fused by induction heating. Crystal growth was performed at a temperature gradient of 10° C./min in a vertical direction to the crucible so that the upper portion temperature of the fused solution is lower than the lower portion temperature of the fused solution. As a result, growth speeds of 60 μm/h in the Comparative Example, and 150 μm/h in the Example were able to be obtained.

According to the above description, it was confirmed that the silicon-based fusion composition according to an exemplary embodiment of the present invention may provide the silicon carbide single crystal having high quality, and also reduce time and cost required for the process by a rapid growth speed.

Hereinbefore, the certain exemplary embodiments of the present invention have been described and illustrated, however, it is apparent to a person with ordinary skill in the art that the present invention is not limited to the exemplary embodiment as described, and may be variously modified and transformed without departing from the spirit and scope of the present invention. Accordingly, the modified or transformed exemplary embodiments as such may not be understood separately from the technical ideas and aspects of the present invention, and the modified exemplary embodiments are within the scope of the claims of the present invention.

DESCRIPTION OF SYMBOLS

100: Chamber
210: Seed crystal
300: Crucible
400: Heating member
500: Rotating member

The invention claimed is:

1. A silicon fusion composition for a solution growth method for forming a silicon carbide single crystal, comprising: silicon, a first metal (M1), scandium (Sc) and aluminum (Al),
as represented by the following Formula 1:

(Formula 1)

wherein a is more than 0.4 and less than 0.8, b is more than 0.2 and less than 0.6, c is more than 0.01 and less than 0.1, and d is more than 0.01 and less than 0.1, and wherein the first metal (M1) is one or more selected from the group consisting of titanium (Ti), chromium (Cr), vanadium (V), yttrium (Y), iron (Fe), cobalt (Co), boron (B), cerium (Ce), lanthanum (La) and praseodymium (Pr).

2. The silicon fusion composition of claim 1, wherein:
in Formula 1, a is more than 0.5 and less than 0.7, b is more than 0.2 and less than 0.4, and d is more than 0.01 and less than 0.05.

3. The silicon fusion composition of claim 1, wherein:
the silicon fusion composition has a carbon solubility of 5% or more.

4. A silicon fused solution, comprising: the silicon fusion composition of claim 1 and carbon, wherein the scandium increases a carbon solubility in the silicon fused solution.

5. A manufacturing method of a silicon carbide single crystal comprising:
preparing a silicon carbide seed crystal;
preparing a silicon fusion composition comprising: silicon (Si), a first metal (M1), scandium (Sc) and aluminum (Al), as represented by the following Formula 1:

$Si_a M1_b Sc_c Al_d$  (Formula 1)

wherein a is more than 0.4 and less than 0.8, b is more than 0.2 and less than 0.6 m, c is more than 0.01 and less than 0.1, and d is more than 0.01 and less than 0.1;
adding carbon (C) to the silicon fusion composition to form a fused solution, and
supercooling the fused solution to produce a supersaturation state in the vicinity of the seed crystal in order to grow the silicon carbide single crystal on the seed crystal.

6. The manufacturing method of a silicon carbide single crystal of claim 5, wherein:
the first metal (M1) is one or more selected from the group consisting of titanium (Ti), chromium (Cr), vanadium (V), yttrium (Y), manganese (Mn), iron (Fe), cobalt (Co), boron (B), cerium (Ce), lanthanum (La) and praseodymium (Pr).

7. The manufacturing method of a silicon carbide single crystal of claim 5, wherein:
in Formula 1, a is more than 0.5 and less than 0.7, b is more than 0.2 and less than 0.4, and d is more than 0.01 and less than 0.05.

8. The manufacturing method of a silicon carbide single crystal of claim 5, wherein:
the silicon fusion composition has a carbon solubility of 5% or more.

9. The manufacturing method of a silicon carbide single crystal of claim 5, wherein:
the scandium increases a carbon solubility in the fused solution.

10. The manufacturing method of a silicon carbide single crystal of claim 5, wherein:
a growth speed of the silicon carbide is 80 μm/h or more.

* * * * *